US009835955B2

(12) United States Patent
Liu

(10) Patent No.: US 9,835,955 B2
(45) Date of Patent: Dec. 5, 2017

(54) LITHOGRAPHY MODEL FOR 3D TOPOGRAPHIC WAFERS

(75) Inventor: Peng Liu, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 13/570,209

(22) Filed: Aug. 8, 2012

(65) Prior Publication Data
US 2013/0042211 A1    Feb. 14, 2013

Related U.S. Application Data

(60) Provisional application No. 61/521,638, filed on Aug. 9, 2011, provisional application No. 61/534,670, filed on Sep. 14, 2011, provisional application No. 61/606,817, filed on Mar. 5, 2012.

(51) Int. Cl.
G06F 17/50    (2006.01)
G03F 7/20    (2006.01)

(52) U.S. Cl.
CPC .................... G03F 7/705 (2013.01)

(58) Field of Classification Search
USPC .................... 716/51, 52, 53, 54, 55
See application file for complete search history.

(56) References Cited

U.S. PATENT DOCUMENTS 5,656,182 A * 8/1997 Marchman .......... G03F 7/70558
216/12
5,825,040 A * 10/1998 Marrian .............. H01J 37/3026
250/398
6,871,337 B2 * 3/2005 Socha ............................. 716/54
7,030,966 B2 * 4/2006 Hansen ........................ 355/67
7,037,626 B2 * 5/2006 Dirksen et al. .................. 430/5
7,266,480 B2 * 9/2007 Adam ............................ 703/2
7,587,704 B2    9/2009 Ye et al.
7,703,069 B1    4/2010 Liu et al.
7,921,383 B1 * 4/2011 Wei ............................. 716/54
2007/0082281 A1    4/2007 Melvin, III et al.
2007/0122719 A1 * 5/2007 Van Den Broeke et al. ..... 430/5
(Continued)

OTHER PUBLICATIONS

Roger Robbins, Photomask Making, The University of Texas at Dallas, 24 pages, Mar. 2007.*
(Continued)

Primary Examiner — Brian Ngo
(74) Attorney, Agent, or Firm — Pillsbury Winthrop Shaw Pittman LLP

(57) ABSTRACT

Described herein is a method for simulating an image formed within a resist layer on a substrate resulting from an incident radiation, wherein the method accounts for scattering of the incident radiation due to features in or underlying the resist layer. Embodiments of the invention include calculating a forward propagating electric field or forward propagating magnetic field resultant from the incident radiation at a depth in the resist layer, calculating a backward propagating electric field or backward propagating magnetic field resultant from the incident radiation at the depth in the resist layer, and calculating a radiation field at the depth in the resist layer from the forward propagating electric field or forward propagating magnetic field and from the backward propagating electric field or backward propagating magnetic field.

24 Claims, 14 Drawing Sheets

(56) References Cited

U.S. PATENT DOCUMENTS

| | | | |
|---|---|---|---|
| 2009/0199137 A1 | 8/2009 | Huckabay et al. | |
| 2010/0095264 A1 | 4/2010 | Huang et al. | |
| 2010/0162199 A1 | 6/2010 | Liu et al. | |
| 2010/0169060 A1 | 7/2010 | Zhu | |
| 2010/0227280 A1* | 9/2010 | Quaedackers | G03F 7/70466 430/323 |
| 2011/0145769 A1* | 6/2011 | Wei | 716/56 |
| 2011/0199596 A1* | 8/2011 | Middlebrooks | G03F 7/705 355/53 |
| 2011/0216293 A1* | 9/2011 | Padiy | G03F 7/70516 355/52 |
| 2011/0318672 A1* | 12/2011 | Ogadhoh et al. | 430/5 |

OTHER PUBLICATIONS

Andreas Erdmann et al., "Rigorous Simulation of Exposure over Non-Planar Wafers," Optical Microlithography XVI, Proc. of SPIE, vol. 5040, pp. 101-111 (2003).

Hans-Jürgen Stock et al., "Virtual Fab Flow for Wafer Topography Aware OPC," Optical Microlithography XXIII, Proc. of SPIE, vol. 7640, pp. 76401U-1-76401U-12 (2010).

Hua Song et al., "Wafer Topography Proximity Effect Modeling and Correction for Implant Layer Patterning," Photomask Technology 2009, Proc. of SPIE, vol. 7488, pp. 74883F-1-74883F-9 (2009).

Nikolay Voznesenskiy et al., "Large Scale Model of Wafer Topography Effects," Optical Microlithography XXIV, Proc. of SPIE, vol. 7973, pp. 79732G-1-79732G-8 (2011).

Dongbing Shao et al, "Substrate Aware OPC Rules for Edge Effect in Block Levels," Photomask Technology 2010, Proc. of SPIE, vol. 7823, pp. 78233U-1-78233U-9 (2010).

Peng Liu et al., "Fast and accurate 3D mask model for full-chip OPC and verification," Optical Microlithography XX, Proc. of SPIE, vol. 6520, pp. 65200R-1-65200R-12 (2007).

Dongbing Shao et al., "Physical Resist Model Calibration for Implant Level Using Laser-written Photomasks," Photomask Technology 2010, Proc. of SPIE, vol. 7823, pp. 78230U-1-78230U-11 (2010).

* cited by examiner

LITHOGRAPHY MODEL FOR 3D TOPOGRAPHIC WAFERS

CROSS-REFERENCE TO RELATED APPLICATIONS

This application claims priority to U.S. Provisional Application Nos. 61/521,638 filed Aug. 9, 2011, 61/534,670 filed Sep. 14, 2011, and 61/606,817 filed Mar. 5, 2012, the contents of which are incorporated herein by reference in their entirety.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g., an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-k1 lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example of RET, optical proximity correction (OPC), addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature. In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to the deep ultraviolet spectral range to expose photosensitive resist on a substrate. In the future, extreme ultraviolet (EUV) and soft x-rays may be employed. Following exposure, the resist is developed to yield a resist image.

Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 37 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4 or 5. Because of this the pattern at the mask level is typically larger than the desired pattern at the wafer level, which relaxes the dimensional control tolerances required at the mask level and improves the yield and manufacturability of the mask-making process. This reduction factor of the exposure tool introduces certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. For the exposure process to be viable in a manufacturing environment, the full CD distribution must fall within the tolerance limits across a range of process conditions that represents the typical range of process variations expected to occur in the fab. For example, the actual doses of nominally identical process conditions can vary up to ±5% from the nominal dose; the actual focal planes of nominally identical process conditions can vary up to ±100 nm from the nominal focal plane.

Factors that limit or degrade the fidelity of the pattern transfer process include imperfections in the mask-making process, in the projection optics, in the resist process, and in the control of the interaction between the projected light and the film stacks formed on the wafer. However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool. These optical proximity effects are well known in the literature.

In an effort to improve imaging quality and minimize high non-linearity in the pattern transfer process, current processing techniques employ various RET and OPC, a general term for any technology aimed at overcoming proximity effects. One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a wafer under some or all conditions in the process window. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

Many of these OPC techniques can be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added has an effect on other features, which then can be re-corrected in turn, and the results can be iterated repeatedly to converge to a mask layout where each feature can be printed in the manner in which it was originally intended while at the same time contributing in the proper manner to the aerial images of its neighboring features such that they too are printed within their respective tolerances.

SUMMARY

Described herein is a method for simulating an image formed within a resist layer on a substrate resulting from an incident radiation, the method comprising: calculating a forward propagating electric field or forward propagating magnetic field resultant from the incident radiation at a depth in the resist layer; calculating a backward propagating electric field or backward propagating magnetic field resultant from the incident radiation at the depth in the resist layer; calculating a radiation field at the depth in the resist layer from the forward propagating electric field or forward propagating magnetic field and from the backward propagating electric field or backward propagating magnetic field while ignoring an interference between the forward propagating electric field or forward propagating magnetic field and the backward propagating electric field or backward propagating magnetic field.

BRIEF DESCRIPTION OF THE DRAWINGS

The specific embodiments are described in conjunction with the accompanying figures, wherein.

DETAILED DESCRIPTION

Embodiments will now be described in detail with reference to the drawings, which are provided as illustrative examples. Notably, the figures and examples below are not meant to limit the scope to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted without obscuration. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. The present inventors recognize that the pattern transfer process from the mask to the substrate during a lithographic process is further complicated by scattering of incident radiation from the projection optics by existing features on the substrate under a resist layer, especially when the existing features are smaller than the wavelength of the incident radiation or when the substrate lacks an anti-reflective coating (BARC).

Figure 1:
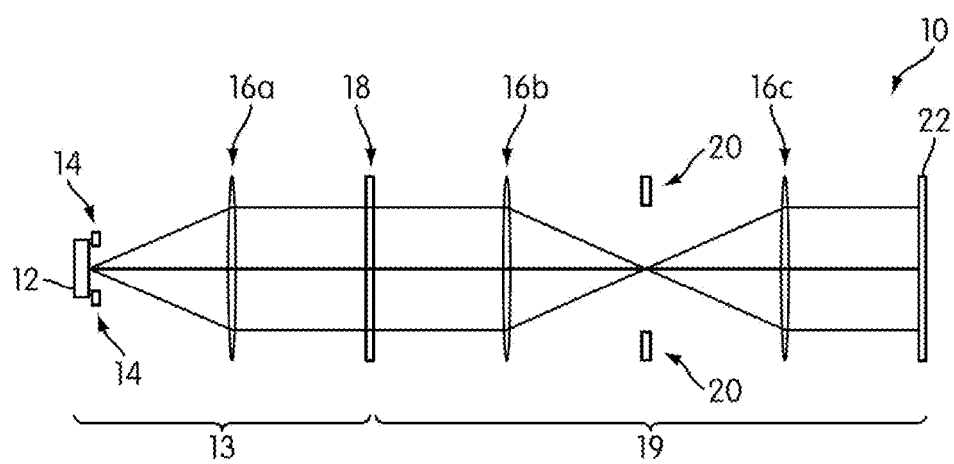
FIG. 1 is a block diagram of various subsystems of a lithography system according to example implementations of the present invention.
Figure 2:
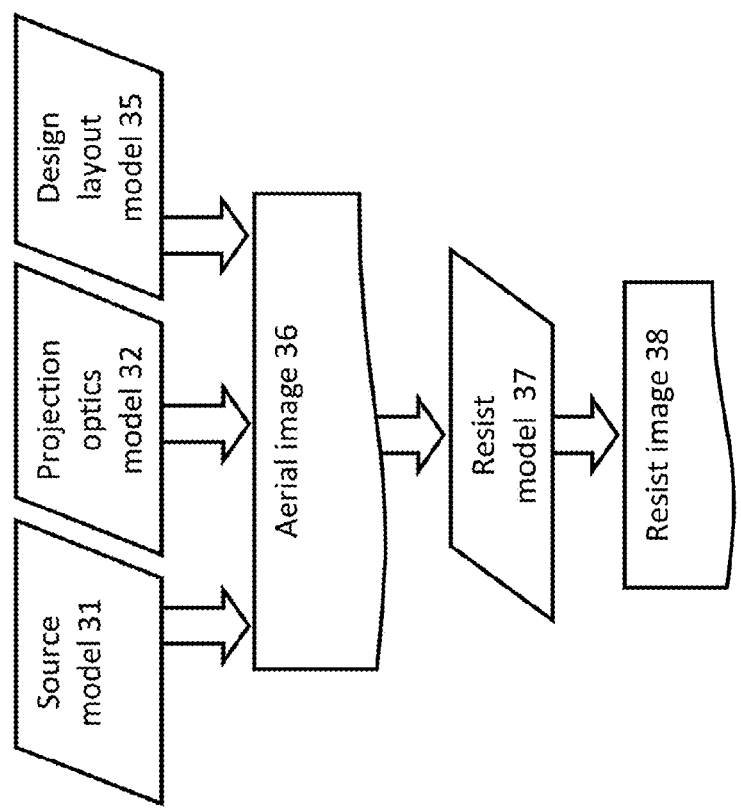
FIG. 2 is a block diagram of simulation models corresponding to the subsystems in FIG. 1.
Figure 3:
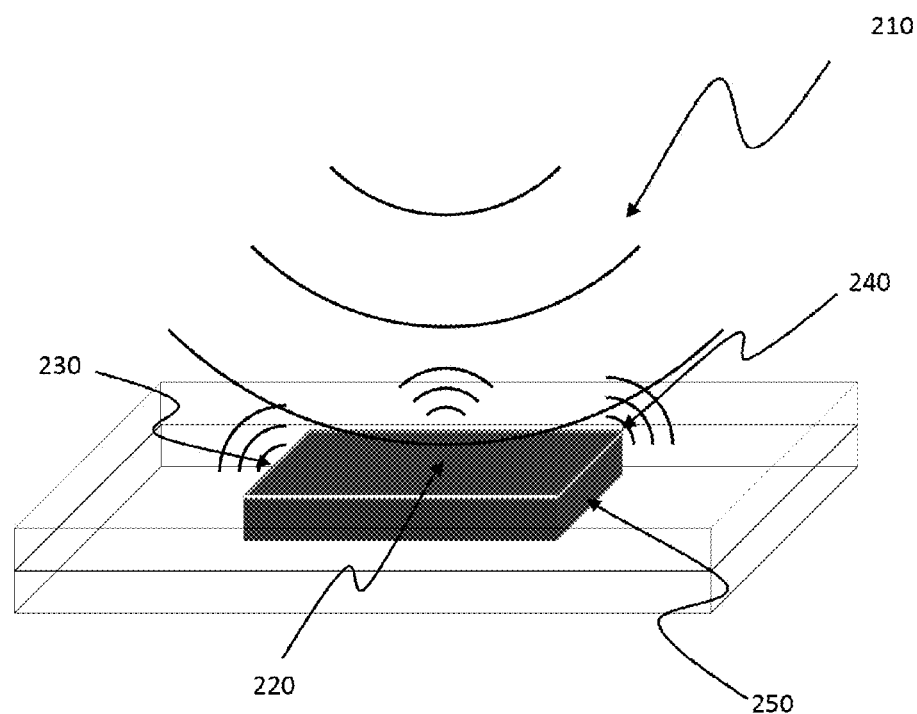
FIG. 3 illustrates scattering of incident radiation from features on a substrate.

As illustrated in FIG. 3, existing features 250 can scatter incident radiation 210 from surfaces 220, edges 230 and corners 240. The term "scatter" or "scattering" as used herein means a combination of effects to incident radiation, which can include reflection, diffraction, and refraction. Scattered radiation can interfere with incident radiation and change spatial intensity distribution of radiation in the resist layer, which in turn changes a resist image formed therein. This scattering can cause distortion to the resultant resist image and therefore should also be compensated for in OPC. The effect of this scattering can be rigorously predicted by solving Maxwell's equations, which however is computationally costly and impractical to apply to a full substrate or a full mask. Conventional approaches, therefore, use only a simple model of the resist behavior when simulating an image in the resist layer.

According to some aspects, a simulated image in a resist layer is computed while accounting for scattered radiation due to features in or on the substrate. In some embodiments, the spatial intensity of distribution of radiation in the resist layer can be derived using an example method depicted in the flow chart of FIG. 4. This method is much less computationally costly and can be applied to a substantially full circuit design or the full mask. First in 300, the feature elements in or on the resist layer are identified, Next in 320, scattering functions of the identified features can be estimated using a library 310 of scattering functions of feature elements such as edges, corners and surfaces, wherein the scattering functions of the feature elements are previously rigorously calculated by solving Maxwell's equations using any suitable method and compiled into the library. The word "library" as used herein means a plurality or a set, with or without any index to facilitate search therein. Alternatively, the scattering functions of feature elements such as edges, corners and surfaces can be rigorously calculated when they are first needed during the estimation of the scattering function of the features. The scattering functions of feature elements can be scattering functions that characterize scattering of radiation by the feature elements in a particular resist. The identification of scattering functions for features performed in 320 can include breaking down the identified features to their components of feature elements and identifying scattering functions of those components of feature elements, which are known from the library 310 or calculated as needed. By collecting together the identified scattering functions from 320, the substrate-specific scattering function is determined in 330, which thereby characterizes scattering of incident radiation within the resist layer by the features identified in 300. Applying the incident radiation (which can be characterized by an electrical field, magnetic field or electromagnetic field at a surface of the resist layer) to the substrate-specific scattering function produces a radiation field in the resist layer resultant from the features, which radiation field is determined in 340. A radiation field in the resist layer resultant from the substrate can be rigorously calculated as performed in 350. A radiation field ("total field" hereafter) in the resist layer is determined in 360 as the sum of the radiation field in the resist layer resultant from the features determined in 340 and the radiation field in the resist layer resultant from the substrate as determined in 350. Optionally, from the total field, spatial intensity distribution of radiation in the resist layer can be derived in 370. Optionally, a resist image 380 from the spatial intensity distribution can be derived in 380 from the spatial intensity distribution of radiation in the resist layer, characteristics of the resist layer and post-exposure processing such as parameters related to developing, baking, etc.

Figure 5:
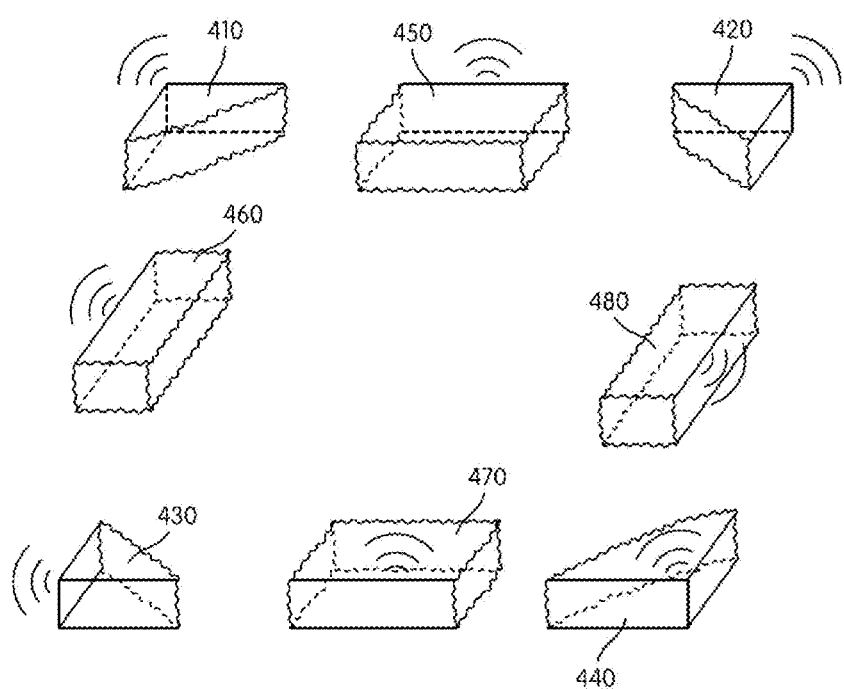
FIG. 5 shows several exemplary feature elements.

FIG. 5 shows several exemplary feature elements whose scattering functions are compiled in the library. The scattering functions of the feature elements preferably are independent from the type of resist on the substrate. These exemplary feature elements in FIG. 5 include corners 410, 420, 430 and 440 and edges 450, 460, 470 and 480. Of course, other feature elements can be included in the library. The scattering function of any feature on a substrate, e.g., feature 250 of FIG. 3, can be estimated from the library comprising scattering functions of suitable feature elements, such as those of FIG. 5.

Figure 4:
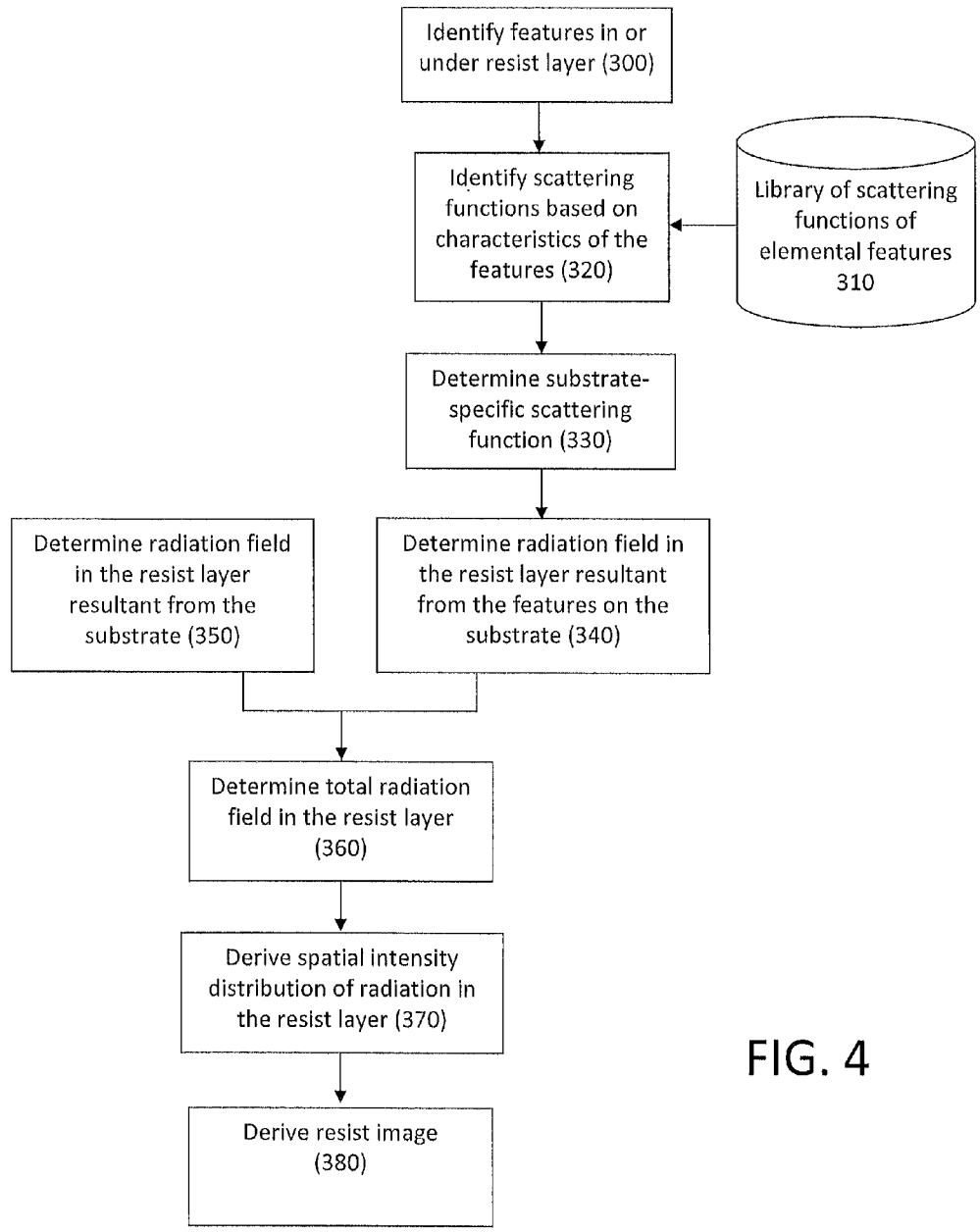
FIG. 4 shows a flow chart of a method according to an embodiment.

The method of FIG. 4 can be mathematically described as follows:

The electric component of the radiation from a source s, on a plane immediately below the mask, can be represented as $$\vec{E}_1(\vec{x}, s) = \sum_{\vec{k}} \vec{\vec{M}}(\vec{k}; \vec{k}_s) \cdot \vec{E}_s e^{j(\vec{k}+\vec{k}_s)\vec{x}},$$

wherein M is a tensor that models scattering of the mask, which can be computed using any suitable method such as Kirchhoff diffraction, M3D, FDTD, etc. k and $k_s$ are wave vectors. x is a location in the real space. $E_s$ is an amplitude of the electric component of the radiation from the source s having the wave vector $k_s$. j is the imaginary unit. $j^2 = -1$.

The electric component of the radiation at a surface of the resist layer can be represented as $$\vec{E}_2(\vec{x}, s) = \sum_{\vec{k}} \vec{\vec{P}}(\vec{k}+\vec{k}_s) \cdot \vec{\vec{M}}(\vec{k}; \vec{k}_s) \cdot \vec{E}_s e^{j(\vec{k}+\vec{k}_s)\vec{x}},$$

wherein P is a tensor that models scattering of the projection optics, which can be computed analytically using any suitable method, and wherein the surface faces the incident radiation during exposure.

From $E_2$, the electric component of the radiation in the resist layer can be represented as $$\vec{E}_3(\vec{r}, s) = \sum_{\vec{k},\vec{q}} \vec{\vec{W}}(\vec{q}; \vec{k}+\vec{k}_s) \cdot \vec{\vec{P}}(\vec{k}+\vec{k}_s) \cdot \vec{\vec{M}}(\vec{k}; \vec{k}_s) \cdot \vec{E}_s e^{j(\vec{q}+\vec{k}+\vec{k}_s)\vec{r}}$$

(Eq. 1), wherein W is a tensor that models scattering of the substrate, the features thereon and the resist layer.

Tensor W can be decomposed into two terms $\vec{\vec{W}}(\vec{q}; \vec{k}+\vec{k}_s) = \delta(\vec{q})\vec{\vec{W}}_0(\vec{k}+\vec{k}_s) + \vec{\vec{S}}(\vec{q}; \vec{k}+\vec{k}_s)$, wherein $\delta(\vec{q})$ is the Dirac delta function; tensor $W_0$ models scattering of the substrate, which is preferably planar, and the resist layer; and tensor S models scattering of the features on the substrate and is the scattering function of the features. Tensor $W_0$ can be rigorously calculated using any suitable method such as FDTD.

The electric component of the radiation in the resist layer thus can be decomposed into two terms $\vec{E}_3(\vec{r}, s) = \vec{E}_3^{(0)}(\vec{r}, s) + \vec{E}_3^{(s)}(\vec{r}, s)$, wherein $$\vec{E}_3^{(0)}(\vec{r}, s) \equiv \sum_{\vec{k}} \vec{\vec{W}}_0(\vec{k}+\vec{k}_s) \cdot \vec{\vec{P}}(\vec{k}+\vec{k}_s) \cdot \vec{\vec{M}}(\vec{k}; \vec{k}_s) \cdot \vec{E}_s e^{j(\vec{k}+\vec{k}_s)\vec{r}}$$

$$\vec{E}_3^{(s)}(\vec{r}, s) \equiv \sum_{\vec{k},\vec{q}} \vec{\vec{S}}(\vec{q}; \vec{k}+\vec{k}_s) \cdot \vec{\vec{P}}(\vec{k}+\vec{k}_s) \cdot \vec{\vec{M}}(\vec{k}; \vec{k}_s) \cdot \vec{E}_s e^{j(\vec{q}+\vec{k}+\vec{k}_s)\vec{r}},$$

Tensor S can be approximated as being polarization-independent: $\vec{\vec{S}}(\vec{q}; \vec{k}+\vec{k}_s) \approx \vec{\vec{S}}(\vec{q})$. Namely, tensor S can be approximated to be independent from the direction of the incident radiation and can be calculated from a component of the incident radiation in a direction perpendicular to a surface of the resist layer wherein the surface faces the incident radiation during exposure. This approximation simplifies the calculation of the tensor S and $\vec{E}_3^{(s)}(\vec{r}, s)$. Of course, tensor S can be calculated for each incident direction.

The electric component of the radiation in the resist layer can then be further simplified as $\vec{E}_3(\vec{r}, s) = \vec{E}_3^{(0)}(\vec{x}, s) + \vec{\vec{S}}(\vec{r}) \cdot \vec{E}_2(\vec{x}, s)$, wherein $$\vec{\vec{S}}(\vec{r}) \equiv \sum_{\vec{q}} \vec{\vec{S}}(\vec{q}) e^{j\vec{q}\vec{r}}.$$

The tensor S in the reciprocal space and the real space can be constructed from the library of scattering functions of feature elements as follows:

$$S(\vec{q}) \approx o(\vec{q}) \cdot f(\vec{q}) + o_V(\vec{g}) \cdot f_V(\vec{q}) + o_H(\vec{q}) \cdot f_H(\vec{q}) + o_C(\vec{q}) \cdot f_C(\vec{q}) \text{ and}$$

$$S(\vec{r}) \approx O(\vec{r}) \otimes F(\vec{r}) + O_V(\vec{r}) \otimes F_V(\vec{r}) + O_H(\vec{r}) \otimes F_H(\vec{r}) + O_C(\vec{r}) \otimes F_C(\vec{r}),$$

respectively, wherein O is an area function of the features; $O_V$ is vertical edge function of the features; $O_H$ is a horizontal edge function of the features; $O_C$ is a corner function of the features; o, $o_V$, $o_H$, $o_C$, are Fourier transforms of O, $O_V$, $O_H$ and $O_C$, respectively; F, $F_V$, $F_H$ and $F_C$ are scattering functions of feature elements in the library; f, $f_V$, $f_H$ and $f_C$ are Fourier transforms of F, $F_V$, $F_H$ and $F_C$, respectively; and ⊗ denotes convolution.

Now with tensor S constructed, the electric component of the radiation in the resist layer $E_3$ can be derived from Eq. 1.

Spatial intensity distribution of radiation is simply the modulus square of the electric component of the radiation field in the resist layer.

The resist image can be estimated from the spatial intensity distribution by applying a blur such as Gaussian blur and applying a threshold. Of course, the resist image can be estimated using any other suitable methods. This estimation process (e.g., parameters in the Gaussian blur) depends on the characteristics of the resist and any post-exposure processing such as developing and baking.

Figure 6A:
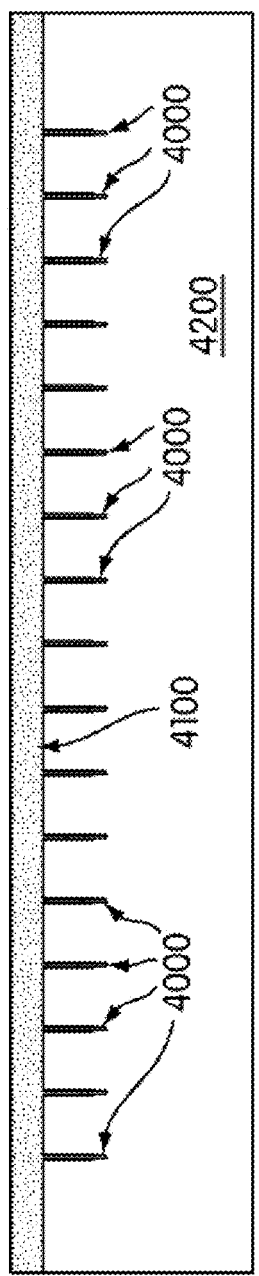
FIG. 6A shows exemplary features under a resist layer on a substrate.
Figure 6B:
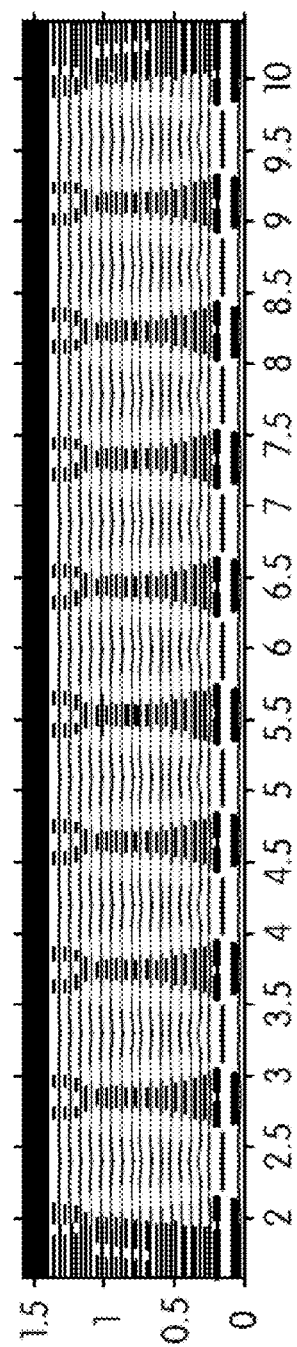
FIG. 6B shows the radiation field in the resist layer resultant from the substrate of FIG. 6A.
Figure 6C:
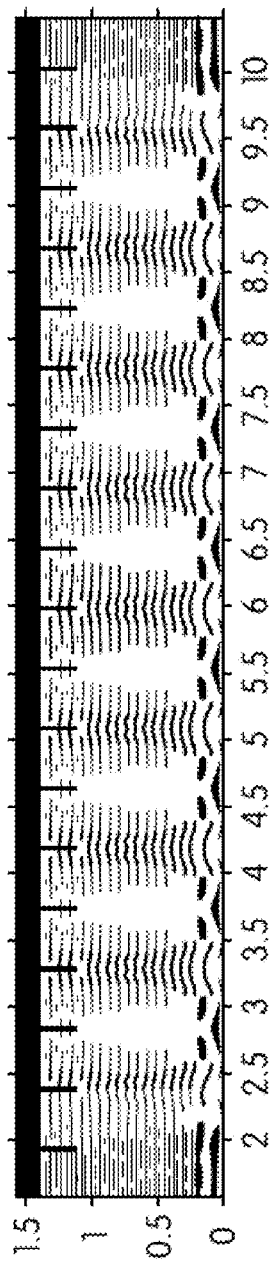
FIG. 6C shows the radiation field in the resist layer resultant from the features of FIG. 6A as calculated using FDTD.
Figure 6D:
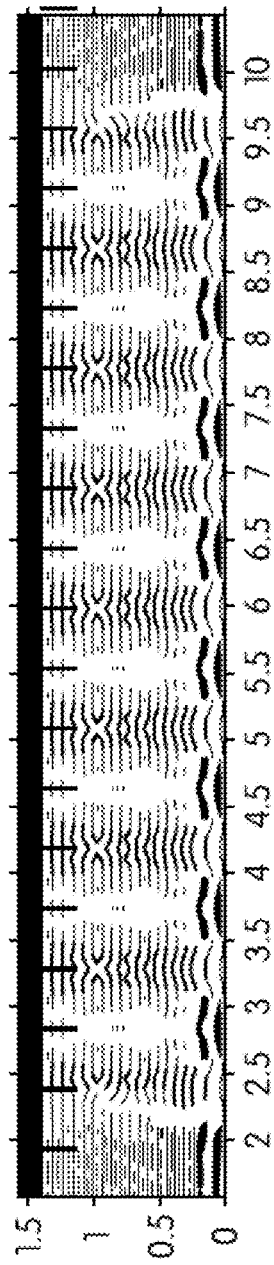
FIG. 6D shows the radiation field in the resist layer resultant from the features of FIG. 6A as calculated using a method according to an embodiment.

FIG. 6A shows exemplary features 4000 under a resist layer 4200 on a substrate 4100. FIG. 6B shows the radiation field in the resist layer 4200 resultant from the substrate 4100. FIG. 6C shows the radiation field in the resist layer 4200 resultant from the features 4100 as calculated using FDTD (Finite-difference time-domain method). FIG. 6D shows the radiation field in the resist layer 4200 resultant from the features 4100 as calculated using the method described herein, which captures almost all details of FIG. 6C.

Figure 7:
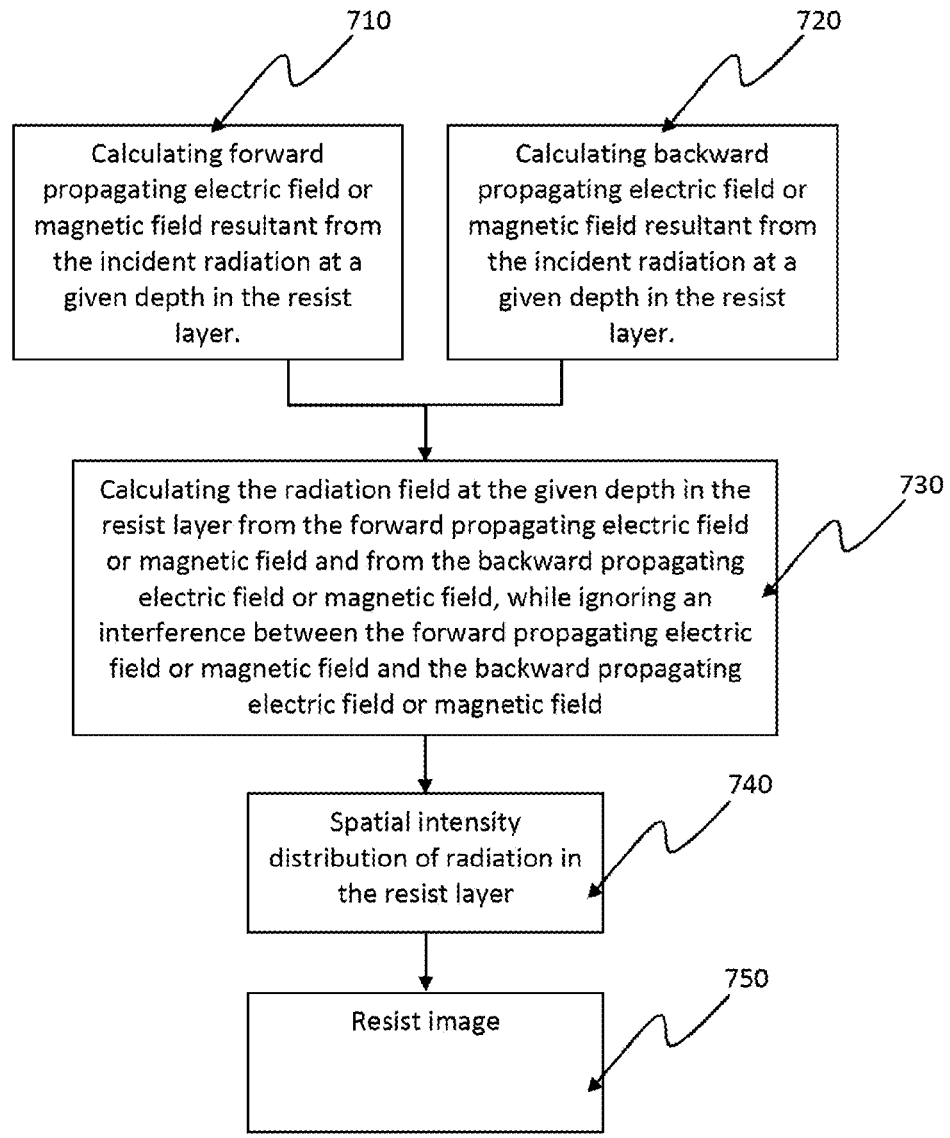
FIG. 7 shows a flow chart of a method according to an embodiment.
Figure 8:
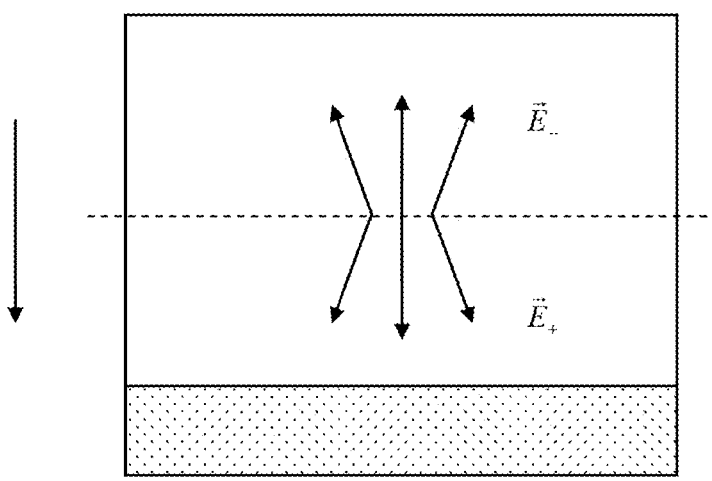
FIG. 8 shows schematic of forward propagating electric field and backward propagating electric field at a given depth in the resist layer.

In some embodiments, the spatial intensity of distribution of radiation in the resist layer can be derived using an example method depicted in the flow chart of FIG. 7. This method is much less computationally costly and can be applied to a substantially full circuit design or the full mask. In step 710, forward propagating electric field or forward propagating magnetic field resultant from the incident radiation at a given depth z in the resist layer is calculated. In step 720, backward propagating electric field or backward propagating magnetic field resultant from the incident radiation at a given depth z in the resist layer is calculated. For the purpose to deriving the resist image, using the electric field and using the magnetic field are equivalent. For simplicity, the following description uses the electric field. Here, the phrase "forward propagating" and "backward propagating" mean the electric field or magnetic field propagating towards (along the arrow on the left side of FIG. 8) the substrate (dot-hatched portion) underlying the resist layer (unhatched portion above the dot-hatched portion) and the electric field or magnetic field propagating away from the substrate underlying the resist layer, respectively (FIG. 8). Both the forward propagating electric field $\vec{E}_+$ and the backward propagating electric field $\vec{E}_-$ may be calculated analytically (e.g., using Maxwell's equations) or using a numerical method such as FDTD and Rigorous Coupled-Wave Analysis (RCWA). Both $\vec{E}_+$ and $\vec{E}_-$ may have contribution from scattering from existing features on the substrate under the resist layer.

In step 730, a radiation field ("total radiation field" hereafter) at the given depth in the resist layer is calculated from $\vec{E}_+$ and $\vec{E}_-$, while ignoring an interference between $\vec{E}_+$ and $\vec{E}_-$ (i.e., "incoherent sum"). For example, a radiation field from $\vec{E}_+$ alone (i.e., without contribution from $\vec{E}_-$) (hereafter "forward radiation field") can be calculated; a radiation field from $\vec{E}_-$ alone (i.e., without contribution from $\vec{E}_+$) (hereafter "backward radiation field") can be calculated; and the total radiation field is the sum of the forward radiation field and the backward radiation field. Alternatively, the total radiation field can be calculated from $\vec{E}_+$ and $\vec{E}_-$ without explicitly calculating the forward radiation field and the backward radiation field.

Optionally, from the total radiation field, spatial intensity distribution of radiation 740 in the resist layer (i.e., aerial image) can be derived. Optionally, a resist image 750 from the spatial intensity distribution can be derived from the spatial intensity distribution of radiation 740 in the resist layer, characteristics of the resist layer and post-exposure processing such as parameters related to developing, baking, etc.

Spatial intensity distribution of radiation is simply the modulus square of the electric component of the radiation field in the resist layer.

In one example, the aerial image can be calculated using a transmission cross coefficient (TCC). A TCC is defined as $TCC_{k',k''} = \Sigma_k A(k)^2 L(k+k') L^*(k+k'')$. The aerial image AI can be expressed as $$AI(x) = \sum_k \left| A(k) \sum_{k'} M(k'-k) L(k') \exp(-jk'x) \right|^2 = \sum_k$$

$$A(k)^2 \left[ \sum_{k'} \sum_{k''} M(k'-k) L(k') M^*(k''-k) L^*(k'') \exp(-j(k'-k'')x) \right] =$$

$$\sum_{k'} \sum_{k''} \left[ \sum_k A(k)^2 L(k+k') L^*(k+k'') \right]$$

$$M(k') M^*(k'') \exp(-j(k'-k'')x) =$$

$$\sum_{k'} \sum_{k''} TCC_{k',k''} M(k') M^*(k'') \exp(-j(k'-k'')x)$$

AI(x) is the aerial image in the space domain. A(k) is the source amplitude from point k on the source pupil plane. L(k) is the projection optics function for point k on the lens pupil plane. The projection optics function in the space domain represents distortions caused by the projection optics to the light passing through the projection optics (e.g., distortions in amplitude, phase or both) as a function of location. The projection optics function can also be generalized to include distortions caused by the filmstack including the resist layer. M(k) is the mask function (i.e., design layout function) in the spatial frequency domain, and can be obtained from the mask function in the space domain by a Fourier transform. The mask function in the space domain represents distortions caused by the mask to the light passing through the mask (e.g., distortions in amplitude, phase or both) as a function of location. More details can be found in, for example, in U.S. Pat. No. 7,587,704, which is incorporated by reference in its entirety. A function in the space domain can be transformed to a corresponding function in the spatial frequency domain and vice versa by Fourier transform. Here, x and k are both vectors.

Specifically, L(k+k') may be split into two terms $L(k+k') = L_+(k+k') + L_-(k+k')$, wherein $L_+(k+k')$ represents distortions caused by the projection optics and the filmstack to the forward propagating light and $L_-(k+k')$ represents distortions caused by the projection optics and the filmstack to the backward propagating light.

$TCC_{k',k''}$ can then be separated into two parts $TCC_{k',k''} = TCC_{a,k',k''} + TCC_{b,k',k''}$, wherein $TCC_{a,k',k''} = \Sigma_k A(k)^2 (L_+(k+k') L^*_+(k+k'') + L_-(k+k') L^*_-(k+k''))$ and $TCC_{b,k',k''} = \Sigma_k A(k)^2 (L_+(k+k') L^*_-(k+k'') + L_-(k+k') L^*_+(k+k''))$. $TCC_{a,k',k''}$ represents an incoherent sum of the forward propagating light and the backward propagating light. $TCC_{b,k',k''}$ represents interference between the forward propagating light (forward propagating electric field or forward propagating magnetic field) and the backward propagating light (backward propagating electric field or backward propagating magnetic field).

$TCC_{b,k',k''}$ may be omitted according to the method in FIG. 7. Therefore, $AI(x) \approx \Sigma_{k'} \Sigma_{k''} TCC_{a,k',k''} M(k') M^*(k'') \exp(-j(k'-k'')x)$.

The resist image can be estimated from the spatial intensity distribution by applying a blur such as Gaussian blur and applying a threshold. Of course, the resist image can be estimated using any other suitable methods. This estimation process (e.g., parameters in the Gaussian blur) depends on the characteristics of the resist and any post-exposure processing such as developing and baking.

Figure 9A:
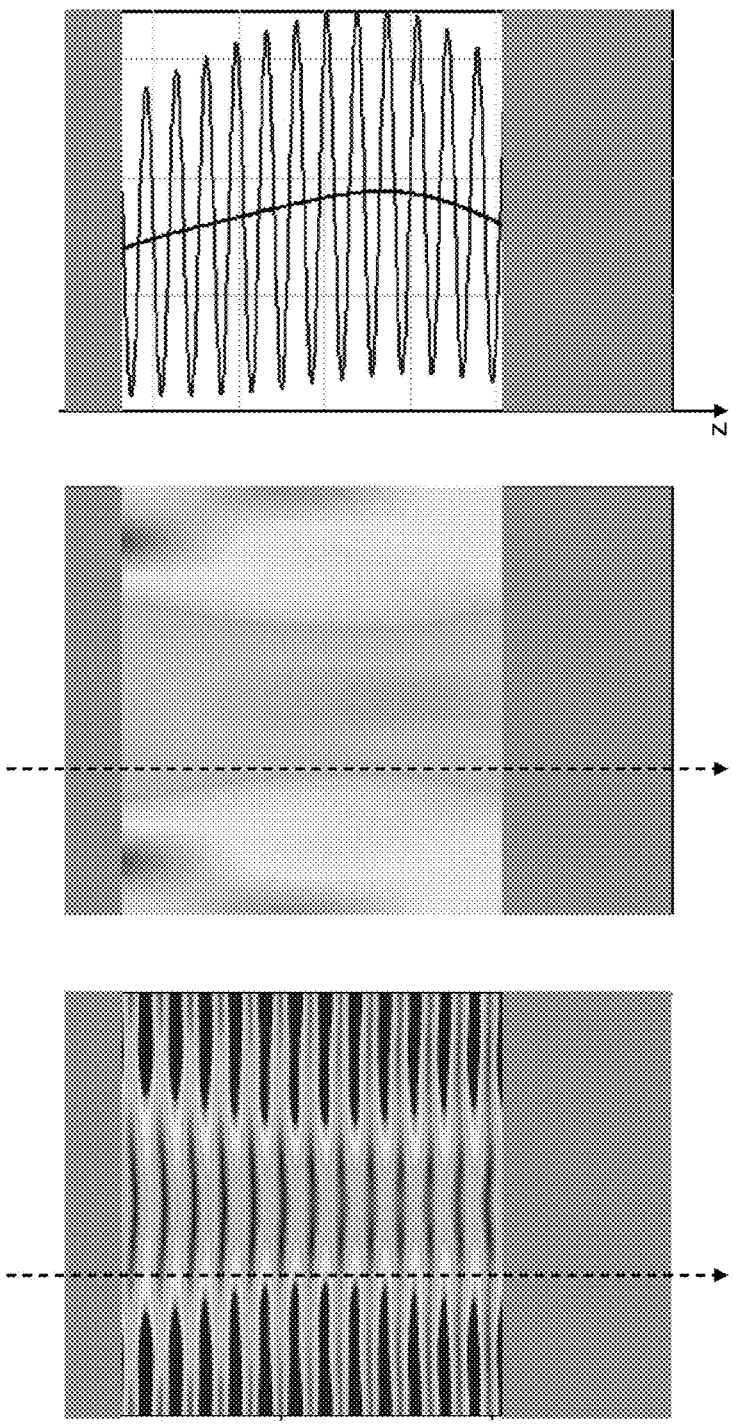
FIG. 9A: left panel shows the radiation field in the resist layer resultant from a planar filmstack as calculated using a rigorous method such as FDTD; middle panel shows the radiation field in the resist layer resultant from the same planar filmstack using the method in FIG. 7; right panel shows cross sections through the radiation fields of the left and middle panels at a same location.
Figure 9B:
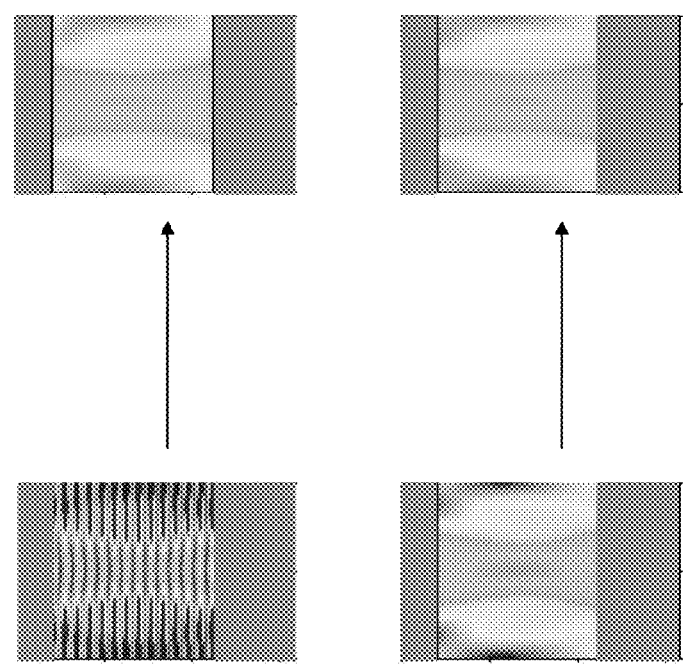
FIG. 9B shows the resist images derived from the radiation field in the left panel of FIG. 9A and the radiation field in the left panel of FIG. 9B, using the same blur.
Figure 9C:
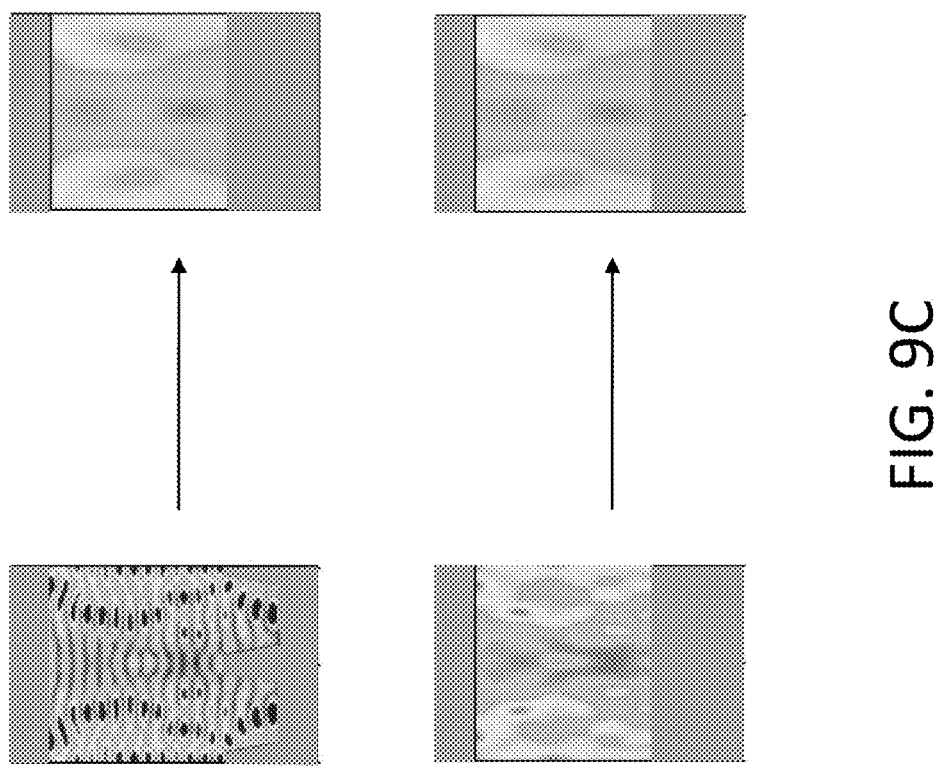
FIG. 9C shows resist images derived from the radiation field in the resist layer resultant from a non-planar filmstack as calculated using a rigorous method such as FDTD, and derived from the radiation field in the resist layer resultant from the same non-planar filmstack using the method in FIG. 7, using the same blur.

FIGS. 9A-9C show that the spatial intensity distribution of radiation in the resist layer calculated using the method in FIG. 7 is as good as that calculated using more computationally costly methods such as FDTD. In FIG. 9A, the left panel shows the radiation field in the resist layer resultant from a planar filmstack as calculated using a rigorous method such as FDTD; the middle panel shows the radiation field in the resist layer resultant from the same planar filmstack using the method in FIG. 7; the right panel shows cross sections through the radiation fields of the left and middle panels at a same location. FIG. 9B shows the resist images (upper and lower right panels of FIG. 9B) derived from the radiation field (upper left panel of FIG. 9B) in the left panel of FIG. 9A and the radiation field (lower left panel of FIG. 9B) in the left panel of FIG. 9B, using a same blur of 50 nm. FIG. 9C shows resist images (upper and lower right panels of FIG. 9C) derived from the radiation field (upper left panel of FIG. 9C) in the resist layer resultant from a non-planar filmstack as calculated using a rigorous method such as FDTD, and derived from the radiation field (lower left panel of FIG. 9C) in the resist layer resultant from the same non-planar filmstack using the method in FIG. 7, using a same blur of 50 nm.

Figure 10:
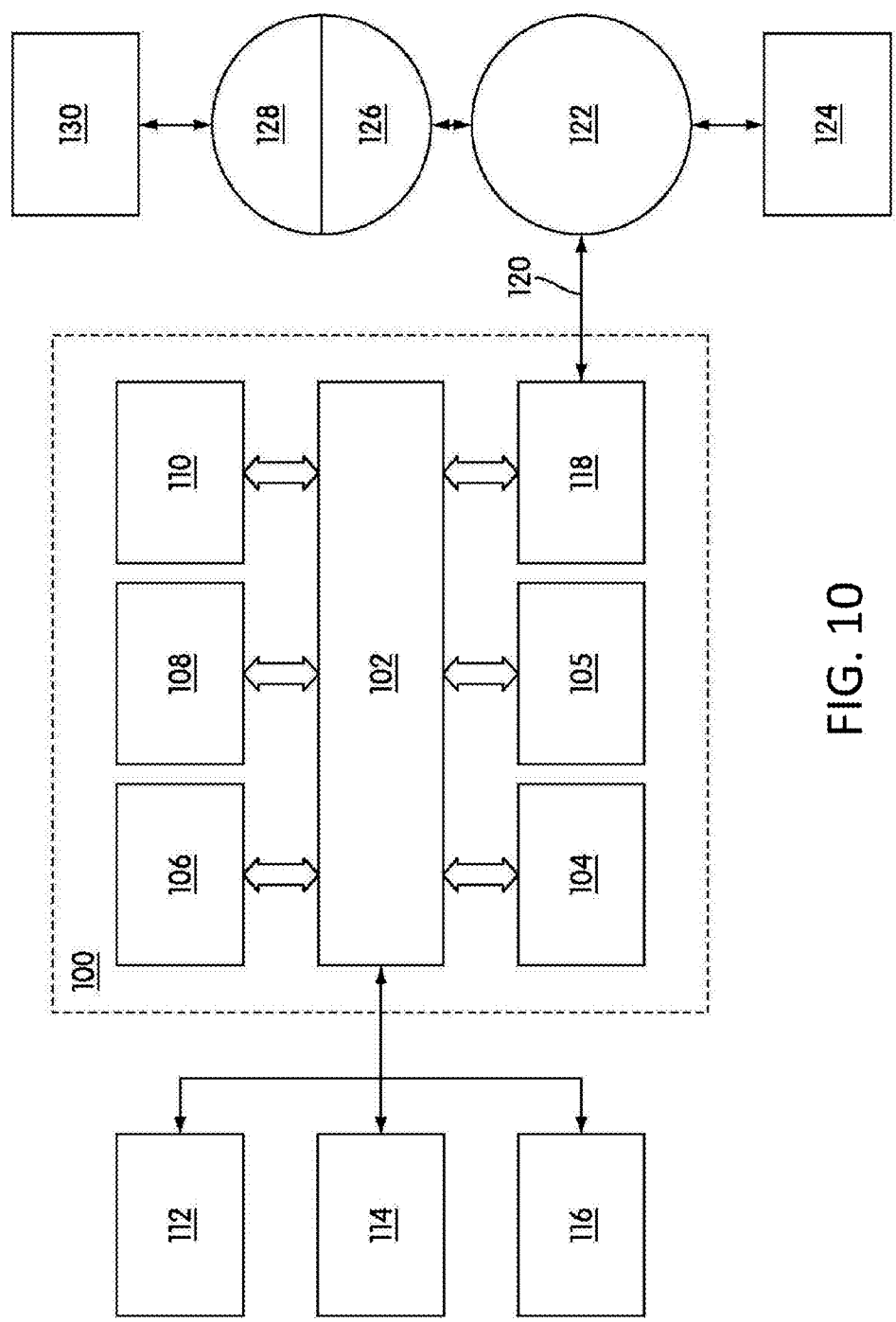
FIG. 10 is a block diagram of an example computer system in which embodiments can be implemented.

FIG. 10 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Figure 11:
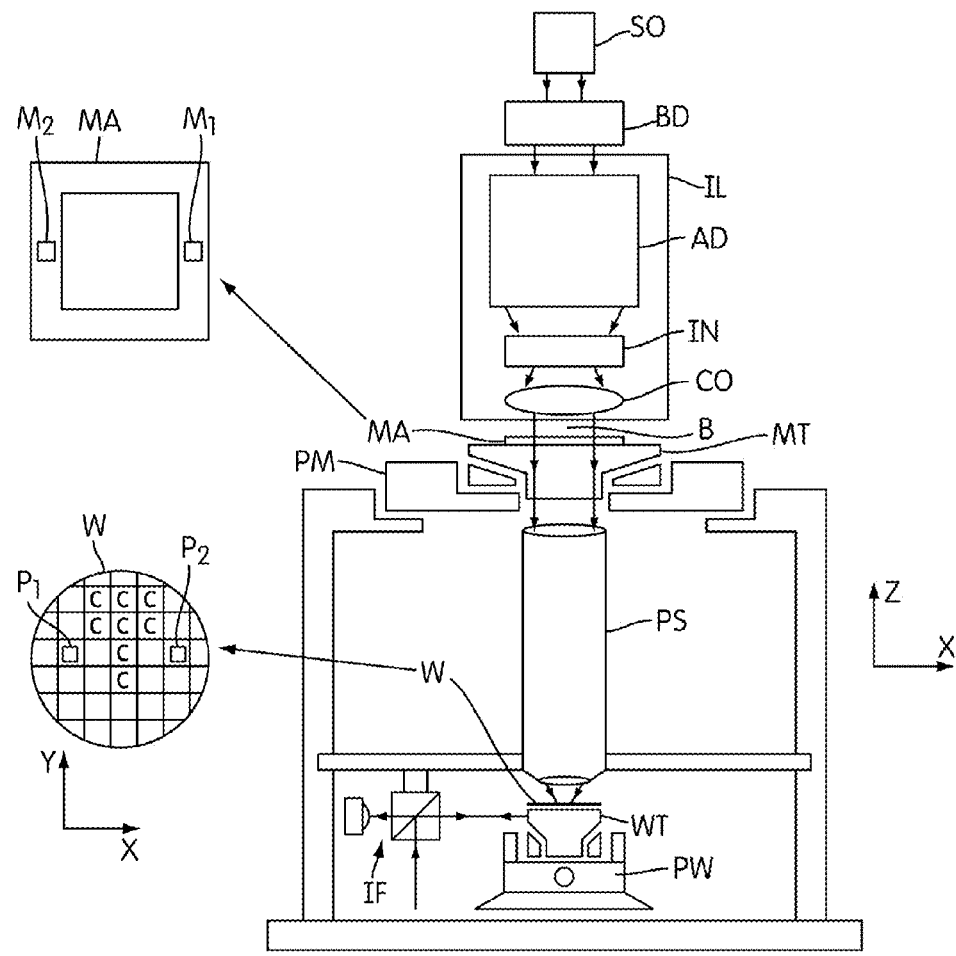
FIG. 11 is a schematic diagram of a lithographic projection apparatus to which embodiments are applicable.

FIG. 11 schematically depicts an exemplary lithographic projection apparatus whose performance could be simulated and/or optimized utilizing the computational lithography models that are calibrated using the test pattern selection process of present invention. The apparatus comprises:

a radiation system IL, for supplying a projection beam B of radiation. In this particular case, the radiation system also comprises a radiation source SO;

a first object table (mask table) MT provided with a mask holder for holding a mask MA (e.g., a reticle), and connected to first positioning means PM for accurately positioning the mask with respect to projection system PS;

a second object table (substrate table) WT provided with a substrate holder for holding a substrate W (e.g., a resist coated silicon wafer), and connected to second positioning means PW for accurately positioning the substrate with respect to projection system PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope. It is intended that the appended claims encompass such changes and modification. The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following items:

Item 1. A method for simulating an image formed within a resist layer on a substrate resulting from an incident radiation, the method comprising: calculating a forward propagating electric field or forward propagating magnetic field resultant from the incident radiation at a depth in the resist layer; calculating a backward propagating electric field or backward propagating magnetic field resultant from the incident radiation at the depth in the resist layer; and calculating a radiation field at the depth in the resist layer from the forward propagating electric field or forward propagating magnetic field and from the backward propagating electric field or backward propagating magnetic field while ignoring an interference between the forward propagating electric field or forward propagating magnetic field and the backward propagating electric field or backward propagating magnetic field.

Item 2. The method of item 1 above, further comprising calculating a forward radiation field from the forward propagating electric field or forward propagating magnetic field alone and calculating a backward radiation field from the backward propagating electric field or backward propagating magnetic field alone.

Item 3. The method of any one of items 1-2 above, further comprising spatial intensity distribution of radiation in the resist layer.

Item 4. The method any one of items 1-3 above, further comprising computing a resist image formed within the resist layer.

Item 5. The method of item 4 above, wherein computing the resist image formed within the resist layer is further based on characteristics of the resist layer.

Item 6. The method of item 4 above, wherein computing the image formed within the resist layer is further based on characteristics of the incident radiation.

Item 7. The method of item 6 above, wherein the characteristics of the incident radiation are selected from the group consisting of an electromagnetic field at a surface of the resist layer, an electric field at a surface of the resist layer and a magnetic field at a surface of the resist layer.

Item 8. The method of any one of items 1-3 above, wherein the substrate has features in or underlying the resist layer.

Item 9. The method of any one of items 1-3 above, wherein the incident radiation has a wavelength in the extreme ultraviolet band.

Item 10, The method of any one of items 1-3 above, wherein the substrate is free of an anti-reflective coating.

Item 11. The method of any one of items 1-3 above, wherein calculating a radiation field at the depth in the resist layer comprises calculating the radiation field using transmission cross coefficients (TCCs).

Item 12. The method of item 11 above, wherein the TCCs are calculated from a projection optics function.

Item 13. The method of item 12 above, wherein the projection optics function is a function of distortions of the incident radiation caused by the resist layer.

Item 14. The method of item 11 above, wherein the TCCs do not represent interference between the forward propagating electric field or forward propagating magnetic field and the backward propagating electric field or backward propagating magnetic field.

Item 15. The method of item 8 above, wherein at least one of the features has a dimension smaller than a wavelength of the incident radiation.

Item 16. The method of item 8 above, further comprising determining a substrate-specific scattering function using one or more scattering functions based on characteristics of the features, wherein the substrate-specific scattering function characterizes scattering of the incident radiation within the resist layer by the features.

Item 17. The method of item 8 above, further comprising computing a substrate-specific scattering function based on the features and one or more scattering functions, each of the one or more scattering functions characteristic of electromagnetic scattering associated with at least one of the features; and computing the electromagnetic field inside the resist layer based on the substrate-specific scattering function and an electromagnetic field provided to the resist layer.

Item 18. The method of item 8 above, further comprising determining a scattering function of a feature element of a feature based on a characteristic of the feature element, wherein the scattering function characterizes scattering of incident radiation within the resist layer by the feature element; and determining a substrate-specific scattering function, wherein the substrate-specific scattering function characterizes scattering of the incident radiation from the substantial part of the design layout within the resist layer by the feature elements underlying an image area of the substantial part of the design layout, the determining of the substrate-specific scattering function comprising re-using the scattering function of the feature element.

Item 19. The method of any one of items 16-18 above, wherein the determining a substrate-specific scattering function is further based on characteristics of the resist layer.

Item 20. The method any one of items 16-19 above, further comprising computing a resist image formed within the resist layer by using the substrate-specific scattering function.

Item 21. The method of item 20 above, wherein computing the resist image formed within the resist layer is further based on characteristics of the resist layer.

Item 22. The method of item 20 above, wherein computing the image formed within the resist layer is further based on characteristics of the incident radiation.

Item 23. The method of item 22 above, wherein the characteristics of the incident radiation are selected from the group consisting of an electromagnetic field at a surface of the resist layer, an electric field at a surface of the resist layer and a magnetic field at a surface of the resist layer.

Item 24. The method of any one of items 16-20 above, wherein the one or more scattering functions characterize scattering of radiation due to a characteristic of a feature element.

Item 25. The method of any one of items 16-20 above, wherein the one or more scattering functions are computed using a rigorous solver.

Item 26. The method of any one of items 16-20 above, further comprising computing an electromagnetic field at a surface of the resist layer resulting from the incident radiation based on characteristics of one or more of a source of radiation, at least a part of a design layout and projection optics; wherein the surface of the resist layer faces the incident radiation during exposure.

Item 27. The method of any one of items 16-20 above, wherein the one or more scattering functions are independent from a direction of the incident radiation.

Item 28. The method of item 24 above, wherein the feature element is a horizontal edge, a vertical edge, an area, a corner, or a combination thereof.

Item 29. The method of any one of items 16-20 above, wherein the incident radiation has a wavelength in the extreme ultraviolet band.

Item 30. The method of any one of items 16-20 above, wherein the substrate is free of an anti-reflective coating.

Item 31. The method of any one of items 16-20 above, wherein at least one of the features has a dimension smaller than a wavelength of the incident radiation.

Item 32. The method of items 16-20 above, wherein the one or more scattering functions are compiled in a library.

Item 33. The method of item 32 above, wherein the library comprises index information.

Item 34. A method for simulating an image formed within a resist layer on a substrate resulting from an incident radiation, the substrate having features in or underlying the resist layer, the method comprising: determining a substrate-specific scattering function using one or more scattering functions based on characteristics of the features, wherein the substrate-specific scattering function characterizes scattering of the incident radiation within the resist layer by the features.

Item 35. The method of item 34 above, wherein the determining a substrate-specific scattering function is further based on characteristics of the resist layer.

Item 36. The method any one of items 34-35 above, further comprising computing a resist image formed within the resist layer by using the substrate-specific scattering function.

Item 37. The method of item 36 above, wherein computing the resist image formed within the resist layer is further based on characteristics of the resist layer.

Item 38. The method of item 36 above, wherein computing the image formed within the resist layer is further based on characteristics of the incident radiation.

Item 39. The method of item 38 above, wherein the characteristics of the incident radiation are selected from the group consisting of an electromagnetic field at a surface of the resist layer, an electric field at a surface of the resist layer and a magnetic field at a surface of the resist layer.

Item 40. The method of any one of items 34-36 above, wherein the one or more scattering functions characterize scattering of radiation due to a characteristic of a feature element.

Item 41. The method of any one of items 34-36 above, wherein the one or more scattering functions are computed using a rigorous solver.

Item 42. The method of any one of items 34-36 above, further comprising computing an electromagnetic field at a surface of the resist layer resulting from the incident radiation based on characteristics of one or more of a source of radiation, at least a part of a design layout and projection optics; wherein the surface of the resist layer faces the incident radiation during exposure.

Item 43. The method of any one of items 34-36 above, wherein the one or more scattering functions are independent from a direction of the incident radiation.

Item 44. The method of item 40 above, wherein the feature element is a horizontal edge, a vertical edge, an area, a corner, or a combination thereof.

Item 45. The method of any one of items 34-36 above, wherein the incident radiation has a wavelength in the extreme ultraviolet band.

Item 46. The method of any one of items 34-36 above, wherein the substrate is free of an anti-reflective coating.

Item 47. The method of any one of items 34-36 above, wherein at least one of the features has a dimension smaller than a wavelength of the incident radiation.

Item 48. The method of items 34-36 above, wherein the one or more scattering functions are compiled in a library.

Item 49. The method of item 48 above, wherein the library comprises index information.

Item 50. A method for determining an electromagnetic field inside a resist layer disposed on a substrate, wherein the substrate, or the resist layer, or both, have features defined by protrusions and/or recesses, the method comprising: computing a substrate-specific scattering function based on the features and one or more scattering functions, each of the one or more scattering functions characteristic of electromagnetic scattering associated with at least one of the features; and computing the electromagnetic field inside the resist layer based on the substrate-specific scattering function and an electromagnetic field provided to the resist layer.

Item 51. The method of item 50 above, further comprising computing the substrate-specific scattering function and/or computing the electromagnetic field inside the resist layer, based on a characteristic of the resist layer.

Item 52. The method of item 50 or item 51 above, wherein the one or more scattering functions are computed using a rigorous solver.

Item 53. The method of any of items 50-52 above, wherein the electromagnetic field is a surface electromagnetic field at a surface of the resist layer and further comprising computing the surface electromagnetic field at the surface of the resist layer based on a characteristic of one or more selected from the group of: a source of the surface electromagnetic field, a patterning device and/or a projection optic.

Item 54. The method of any of items 50-53 above, wherein the one or more scattering functions are independent from a direction of an incident radiation onto the substrate.

Item 55. The method of any of items 50-54 above, wherein the features include a horizontal edge, a vertical edge, an area, a corner, or a combination thereof.

Item 56. The method of any of items 50-55 above, wherein the electromagnetic field has a wavelength in the extreme ultraviolet band.

Item 57. The method of any of items 50-56 above, wherein the substrate is free of an anti-reflective coating.

Item 58. The method of any of items 50-57 above, further comprising determining a resist image based on the electromagnetic field inside the resist layer.

Item 59. The method of any of items 50-58 above, wherein at least one of the features has a dimension smaller than a wavelength of the electromagnetic field inside the resist layer.

Item 60. The method of items 50-59 above, wherein the one or more scattering functions are compiled in a library.

Item 61. The method of item 60 above, wherein the library comprise index information.

Item 62. A method of simulating an image of a substantial part of a design layout to be formed within a resist layer on a substrate, the substrate having features in or underlying the resist layer, the method comprising: determining a scattering function of a feature element of a feature based on a characteristic of the feature element, wherein the scattering function characterizes scattering of incident radiation within the resist layer by the feature element, and determining a substrate-specific scattering function, wherein the substrate-specific scattering function characterizes scattering of the incident radiation from the substantial part of the design layout within the resist layer by the feature elements underlying an image area of the substantial part of the design layout, the determining of the substrate-specific scattering function comprising re-using the scattering function of the feature element.

Item 63. A method of item 62 above, wherein the features in or underlying the resist layer comprise a plurality of feature elements, each having a specific scattering function.

Item 64. A method of item 63 above, wherein at least some of the scattering functions are computed using a rigorous solver.

Item 65. A method of any of the items 62-64 above, wherein the one or more scattering functions are compiled in a library.

Item 66. A method of any of the items 62-65 above, wherein the method further comprises determining the incident radiation from the substantial part of the design layout at a surface of the resist layer facing the incident radiation.

Item 67. The method any one of items 62-66 above, further comprising computing a resist image formed within the resist layer by using the substrate-specific scattering function.

Item 68. A method of any of the items 62-67 above, wherein the one or more scattering functions are independent from a direction of the incident radiation.

Item 69. A method of any of the items 62-68 above, wherein the substantial part of the design layout comprises at least 20% of a circuit design.

Item 70. A computer program product comprising a computer readable medium having instructions recorded thereon, the instructions when executed by a computer implementing the method of any of the above items.

Item 71. A computer program product comprising a computer readable medium, having a library of scattering functions of feature elements recorded thereon, wherein the feature elements are components of features in or underlying a resist layer on a substrate.

Item 72. The computer program product of item 71 above, wherein the library comprises index information.

Item 73. The method of any one of items 34, 50 and 62 above, further comprising: calculating a forward propagating electric field or forward propagating magnetic field resultant from the incident radiation at a depth in the resist layer; calculating a backward propagating electric field or backward propagating magnetic field resultant from the incident radiation at the depth in the resist layer; and calculating a radiation field at the depth in the resist layer from the forward propagating electric field or forward propagating magnetic field and from the backward propagating electric field or backward propagating magnetic field while ignoring an interference between the forward propagating electric field or forward propagating magnetic field and the backward propagating electric field or backward propagating magnetic field.

Item 74. The method of item 73 above, further comprising calculating a forward radiation field from the forward propagating electric field or forward propagating magnetic field alone and calculating a backward radiation field from the backward propagating electric field or backward propagating magnetic field alone.

Item 75, The method of any one of items 72-74 above, further comprising spatial intensity distribution of radiation in the resist layer.

Item 76. The method any one of items 72-74 above, further comprising computing a resist image formed within the resist layer.

Item 77. The method of item 76 above, wherein computing the resist image formed within the resist layer is further based on characteristics of the resist layer.

Item 78. The method of item 76 above, wherein computing the image formed within the resist layer is further based on characteristics of the incident radiation.

Item 79. The method of item 78 above, wherein the characteristics of the incident radiation are selected from the group consisting of an electromagnetic field at a surface of the resist layer, an electric field at a surface of the resist layer and a magnetic field at a surface of the resist layer.

Item 80. The method of any one of items 72-74 above, wherein the incident radiation has a wavelength in the extreme ultraviolet band.

Item 81. The method of any one of items 72-74 above, wherein the substrate is free of an anti-reflective coating.

Item 82. The method of any one of items 72-74 above, wherein calculating a radiation field at the depth in the resist layer comprises calculating the radiation field using transmission cross coefficients (TCCs).

Item 83. The method of item 82 above, wherein the TCCs are calculated from a projection optics function.

Item 84. The method of item 83 above, wherein the projection optics function is a function of distortions of the incident radiation caused by the resist layer.

Item 85. The method of item 82 above, wherein the TCCs do not represent interference between the forward propagating electric field or forward propagating magnetic field and the backward propagating electric field or backward propagating magnetic field.

What is claimed is:

1. A method for characterizing radiation within a resist layer on a substrate, the method comprising:
   identifying features in or underlying the resist layer;
   identifying one or more scattering functions based on one or more characteristics of the features; and
   determining, by a hardware computer, a substrate-specific scattering function from the one or more scattering functions, wherein the substrate-specific scattering function characterizes scattering of incident radiation within the resist layer by the identified features.

2. The method of claim 1, wherein the determining a substrate-specific scattering function is further based on a characteristic of the resist layer.

3. The method of claim 1, further comprising computing a resist image formed within the resist layer by using the substrate-specific scattering function to determine a spatial intensity of distribution of radiation in the resist layer.

4. The method of claim 3, wherein computing the resist image formed within the resist layer is further based on a characteristic of the resist layer.

5. The method of claim 3, wherein computing the resist image formed within the resist layer is further based on a characteristic of the incident radiation.

6. The method of claim 5, wherein the characteristic of the incident radiation comprises one or more selected from: an electromagnetic field at a surface of the resist layer, an electric field at a surface of the resist layer, and/or a magnetic field at a surface of the resist layer.

7. The method of claim 1, wherein the one or more scattering functions characterize scattering of radiation due to a characteristic of a feature element.

8. The method of claim 1, further comprising computing an electromagnetic field at a surface of the resist layer resulting from the incident radiation based on a characteristic of one or more selected from: a source of radiation, at least a part of a design layout, and/or projection optics, wherein the surface of the resist layer faces the incident radiation during exposure.

9. The method of claim 1, wherein the one or more scattering functions are independent from a direction of the incident radiation.

10. The method of claim 7, wherein the feature element is a horizontal edge, a vertical edge, an area, a corner, or any combination selected therefrom.

11. The method of claim 1, wherein the substrate is free of an anti-reflective coating.

12. The method of claim 1, wherein the one or more scattering functions are compiled into a library.

13. The method of claim 1, further comprising:
   calculating a forward propagating electric field or forward propagating magnetic field resultant from the incident radiation at a depth in the resist layer;
   calculating a backward propagating electric field or backward propagating magnetic field resultant from the incident radiation at the depth in the resist layer; and
   calculating a radiation field at the depth in the resist layer from the forward propagating electric field or forward propagating magnetic field and from the backward propagating electric field or backward propagating magnetic field while ignoring an interference between the forward propagating electric field or forward propagating magnetic field and the backward propagating electric field or backward propagating magnetic field.

14. The method of claim 13, wherein calculating a radiation field at the depth in the resist layer comprises calculating the radiation field using transmission cross coefficients (TCCs) to characterize the forward propagating electric field or forward propagating magnetic field and the backward propagating electric field or backward propagating magnetic field.

15. The method of claim 14, wherein the TCCs are calculated from a projection optics function, and wherein the TCCs do not represent interference between the forward propagating electric field or forward propagating magnetic field and the backward propagating electric field or backward propagating magnetic field.

16. The method of claim 1, further comprising:
   determining a spatial intensity distribution of radiation in the resist layer while including effects of the determined substrate-specific scattering function; and
   computing a simulated image in the resist layer based on the determined spatial intensity distribution of radiation.

17. The method of claim 1, wherein the one or more scattering functions are computed using a rigorous solver.

18. A method for characterizing radiation within a resist layer on a substrate, the method comprising:
   determining a scattering function of a feature element of a feature in or underlying the resist layer based on a characteristic of the feature element, wherein the scattering function characterizes scattering of incident radiation within the resist layer by the feature element, and
   determining, by a hardware computer, a substrate-specific scattering function, wherein the substrate-specific scattering function characterizes scattering of the incident radiation from a substantial part of a design layout to be formed within the resist layer by the feature elements underlying an image area of the substantial part of the design layout, the determining of the substrate-specific scattering function comprising incorporating the scattering function of the feature element into the substrate-specific scattering function.

19. A non-transitory computer readable medium having instructions recorded thereon, the instructions when executed by a computer implementing a method comprising:
   identifying one or more scattering functions based on one or more characteristics of features in or underlying a resist layer on a substrate; and
   determining a substrate-specific scattering function from the one or more scattering functions, wherein the substrate-specific scattering function characterizes scattering of incident radiation within the resist layer by the features.

20. A non-transitory computer readable medium having instructions recorded thereon, the instructions when executed by a computer implementing a method comprising:
   determining a scattering function of a feature element of a feature in or underlying a resist layer on a substrate based on a characteristic of the feature element, wherein the scattering function characterizes scattering of incident radiation within the resist layer by the feature element, and
   determining a substrate-specific scattering function, wherein the substrate-specific scattering function characterizes scattering of the incident radiation from a substantial part of a design layout to be formed within the resist layer by feature elements underlying an image area of the substantial part of the design layout, the determining of the substrate-specific scattering function comprising incorporating the scattering function of the feature element into the substrate-specific scattering function.

21. A non-transitory computer readable medium having a library of scattering functions of feature elements recorded thereon, wherein the feature elements are components of features in or underlying a resist layer on a substrate, and wherein each of the scattering functions in the library respectively characterizes scattering of incident radiation within a resist layer by one of the feature elements.

22. The non-transitory computer readable medium of claim 21, wherein the library comprises index information.

23. A method for determining an electromagnetic field inside a resist layer disposed on a substrate, wherein the substrate, or the resist layer, or both, have features defined by protrusions and/or recesses, the method comprising:
computing, by a hardware computer, a substrate-specific scattering function based on the features and one or more scattering functions, each of the one or more scattering functions characterizing electromagnetic radiation scattering associated with at least one of the features; and
computing, by the hardware computer, the electromagnetic field inside the resist layer based on the substrate-specific scattering function and an electromagnetic field provided to the resist layer.

24. A non-transitory computer readable medium having instructions recorded thereon, the instructions, when executed, configured to cause a hardware computer to:
compute a substrate-specific scattering function based on features defined by protrusions and/or recesses of a resist layer disposed on a substrate, of the substrate, or both, and on one or more scattering functions, each of the one or more scattering functions characterizing electromagnetic radiation scattering associated with at least one of the features; and
compute an electromagnetic field inside the resist layer based on the substrate-specific scattering function and an electromagnetic field provided to the resist layer.

* * * * *